United States Patent
Fumitake

(10) Patent No.: US 8,748,247 B2
(45) Date of Patent: Jun. 10, 2014

(54) FIN FIELD-EFFECT-TRANSISTOR (FET) STRUCTURE AND MANUFACTURING METHOD

(71) Applicant: Mieno Fumitake, Shanghai (CN)

(72) Inventor: Mieno Fumitake, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 0 days.

(21) Appl. No.: 13/686,300

(22) Filed: Nov. 27, 2012

(65) Prior Publication Data

US 2013/0313619 A1     Nov. 28, 2013

(30) Foreign Application Priority Data

May 24, 2012 (CN) .......................... 2012 1 0165855

(51) Int. Cl.
*H01L 21/8238* (2006.01)
(52) U.S. Cl.
USPC ........... 438/199; 438/150; 438/157; 438/164; 438/206; 438/212
(58) Field of Classification Search
CPC ............... H01L 21/823431; H01L 21/823821; H01L 21/845; H01L 27/0886; H01L 27/0924; H01L 27/1211
See application file for complete search history.

(56) References Cited

U.S. PATENT DOCUMENTS

| 7,868,380 B2 | 1/2011 | Kim et al. |
| 2008/0149984 A1* | 6/2008 | Chang et al. ................... 257/314 |
| 2013/0168771 A1* | 7/2013 | Wu et al. ........................ 257/351 |

* cited by examiner

*Primary Examiner* — Kyoung Lee
(74) *Attorney, Agent, or Firm* — Anova Law Group, PLLC

(57) ABSTRACT

A method for fabricating a semiconductor structure includes providing a semiconductor substrate having a first region and a second region, and doping top of the semiconductor substrate to form a doped layer at top surface of the semiconductor substrate over the first region and the second region. The method also includes etching the doped layer to form a first sub-fin in the first region and a first sub-fin in the second region, and forming an insulating layer over the semiconductor substrate including the first sub-fin in the first region and the first sub-fin in the second region. Further, the method includes removing top portions of the first sub-fin in the first region and the first sub-fin in the second region and forming corresponding second sub-fins.

20 Claims, 6 Drawing Sheets

S200

- S201 Providing a semiconductor substrate
- S203 Performing a doping process on the semiconductor substrate to form a doped layer located in the surface of the semiconductor substrate
- S205 Forming a hard mask layer on top of the doped layer and etching the doped layer using the hard mask as the mask to form the first sub-fin
- S207 Forming an insulating layer on top of the semiconductor substrate, where the top of the insulating layer levels with the top of the first sub-fin
- S209 After forming the insulating layer, removing the top portion of the sub-fin to form fin openings
- S211 Forming a second sub-fin in the fin openings, where the top of the second sub-fin levels with the top of the insulating layer

FIG. 3

FIN FIELD-EFFECT-TRANSISTOR (FET) STRUCTURE AND MANUFACTURING METHOD

CROSS-REFERENCES TO RELATED APPLICATIONS

This application claims the priority of Chinese patent application no. 201210165855.0, filed on May 24, 2012, the entire contents of all of which are incorporated herein by reference.

FIELD OF THE INVENTION

The present invention relates to the field of semiconductor manufacturing technology and, more particularly, relates to techniques for fabricating fin field-effect-transistors (FETs).

BACKGROUND

With continuous development of semiconductor process technology, the process node gradually decreases, and the gate-last process has been widely applied in order to obtain the ideal threshold voltage and to improve device performance. However, when critical dimension (CD) of semiconductor devices further decreases, even with the gate-last process, conventional MOS field-effect-transistor (MOSFET) structure can no longer meet the requirements on the device performance, such as threshold voltage (VT) variability. As an alternative to conventional devices, multi-gate devices have been gaining widespread attentions.

A fin field-effect-transistor (Fin FET) is a common multi-gate device. FIG. 1 shows a three-dimensional structural diagram of an existing Fin FET. As shown in FIG. 1, the Fin FET includes: a semiconductor substrate 10; a protruding fin 14 formed on the semiconductor substrate 10 generally through etching; a dielectric layer 11 covering the semiconductor substrate 10 and parts of sidewalls of fin 14; and a gate structure 12 across the fin 14 and covering the top and sidewalk of the fin 14. The gate structure 12 includes a gate dielectric layer (not shown) and a gate electrode formed on the gate dielectric layer (not shown). The regions of the top and sidewalls of the fin 14 covered by the gate structure 12 become the channel regions, i.e., with multiple gates. Thus, the drive current can be increased and the device performance can be improved.

However, when the process node is further reduced, such existing fin FET structure may still have device performance issues. The disclosed methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having a first region and a second region, and doping top of the semiconductor substrate to form a doped layer at top surface of the semiconductor substrate over the first region and the second region. The method also includes etching the doped layer to form a first sub-fin in the first region and a first sub-fin in the second region, and forming an insulating layer over the semiconductor substrate including the first sub-fin in the first region and the first sub-fin in the second region. Further, the method includes removing top portions of the first sub-fin in the first region and the first sub-fin in the second region to form a corresponding first opening and second opening, respectively, and forming a second sub-fin in the first opening and a second sub-fin in the second opening such that the first sub-fin in the first region and the second sub-fin in the first opening jointly form a complete fin in the first region, and the first sub-fin in the second region and the second sub-fin in the second opening jointly form a complete fin in the second region.

Another aspect of the present disclosure includes a semiconductor structure. The semiconductor structure includes a semiconductor substrate having a first region and a second region, a doped layer formed at top surface of the semiconductor substrate over the first region and the second region by doping the semiconductor substrate, and a first sub-fin in the first region and a first sub-fin in the second region formed by etching the doped layer. The semiconductor device also includes an insulating layer formed over the semiconductor substrate including the first sub-fin in the first region and the first sub-fin in the second region, and a second sub-fin in the first region and a second sub-fin in the second region formed over the first sub-fin in the first region and the first sub-fin in the second region, respectively. The second sub-fin in the first region and the second sub-fin in the second region are formed by removing top portions of the first sub-fin in the first region and the first sub-fin in the second region to form a corresponding first opening and second opening, respectively, and forming the second sub-fin in the first region in the first opening and the second sub-fin in the second region in the second opening such that the first sub-fin in the first region and the second sub-fin in the first opening jointly form a complete fin in the first region, and the first sub-fin in the second region and the second sub-fin in the second opening jointly form a complete fin in the second region.

Other aspects of the present disclosure can be understood by those skilled in the art in light of the description, the claims, and the drawings of the present disclosure.

BRIEF DESCRIPTION OF THE DRAWINGS

FIG. 3 illustrates an exemplary fabrication process of a semiconductor device consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIG. 3 illustrates an exemplary fabrication process S200 of a semiconductor device, and FIGS. 4-10 illustrate exemplary semiconductor structures forming a semiconductor device 30 corresponding to various stages of the fabrication process S200.

Figure 4:
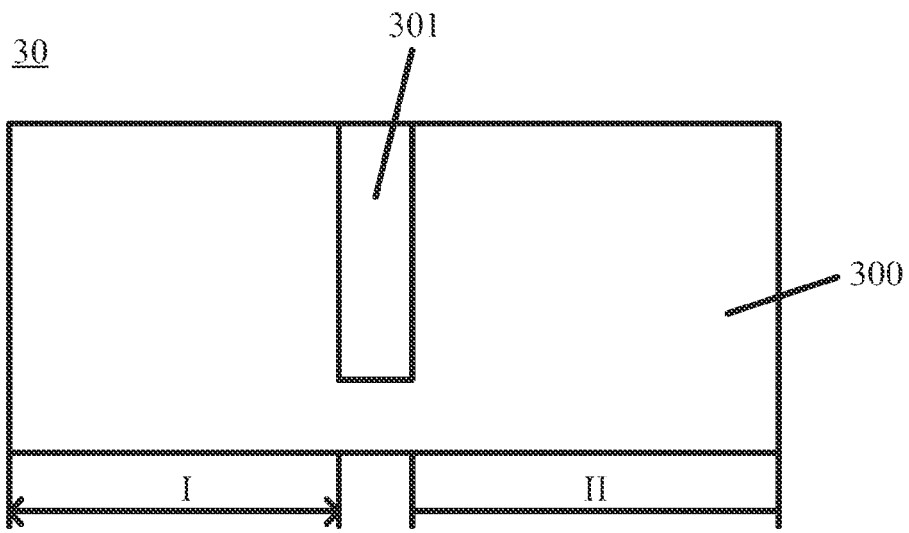
FIGS. 4-10 illustrate exemplary semiconductor structures corresponding to certain stages of the fabrication process consistent with the disclosed embodiments.

As shown in FIG. 3, at the beginning of the fabrication process S200, a semiconductor substrate is provided (S201). FIG. 4 shows a corresponding semiconductor device 30.

As shown in FIG. 4, a semiconductor substrate 300 is provided as the base for the semiconductor device 30. The semiconductor substrate 300 may be made of any appropriate type of semiconductor material, such as silicon, silicon on insulator, silicon germanium (SiGe), carborundum, indium antimonide, lead telluride, indium arsenide, indium phosphide, gallium arsenide or gallium antimonide, alloy semiconductor, or a combination thereof. The semiconductor substrate 300 also provides a base for subsequent processes and structures to form an n-channel and/or p-channel fin field-effect-transistor (Fin FET).

In certain embodiments, the semiconductor substrate 300 is a silicon substrate made of monocrystalline silicon. The semiconductor substrate 300 includes a first region I and a second region II which is adjacent to but isolated from the first region I. The first region I may be used to form a p-channel Fin FET, while the second region II may be used to form an n-channel Fin FET. Alternatively, the first region I and second region II may also be used to form same channel-type Fin FET.

The first region I and the second region II may be isolated or separated by a shallow trench isolation (STI) structure 301. The STI structure 301 may be formed by an insulating material, such as silicon oxide, etc.

Figure 5:
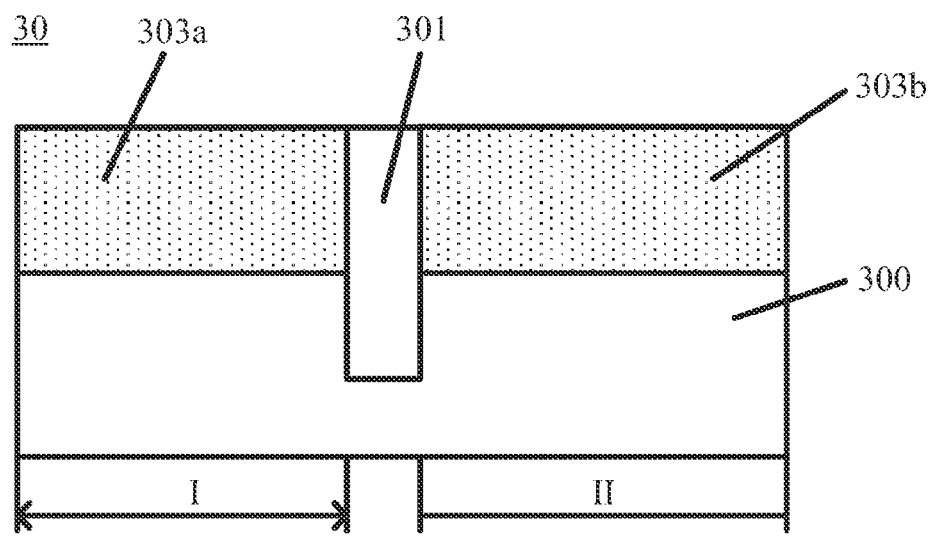

Returning to FIG. 3, after the semiconductor substrate 300 is provided (S201), a doping process is performed on the semiconductor substrate 300 to form a doped layer located at the surface of the semiconductor substrate 300 (S203). FIG. 5 shows a corresponding semiconductor device 30. As shown in FIG. 5, a doped layer (303a, 303b) is formed on top of the semiconductor substrate 300 (region I, region II). The doped layer 303a and 303b may also be referred as a body bias contact layer or a channel stop layer.

Figure 1:
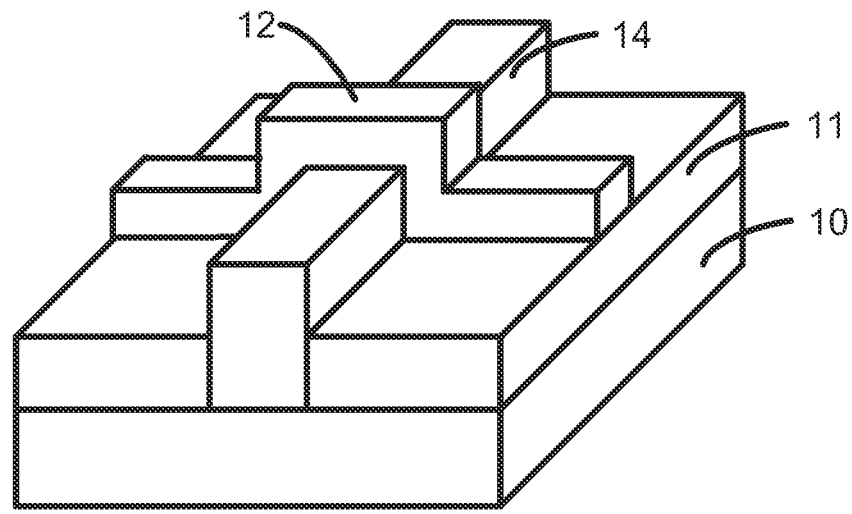
FIG. 1 shows an existing Fin FET structure.
Figure 2:
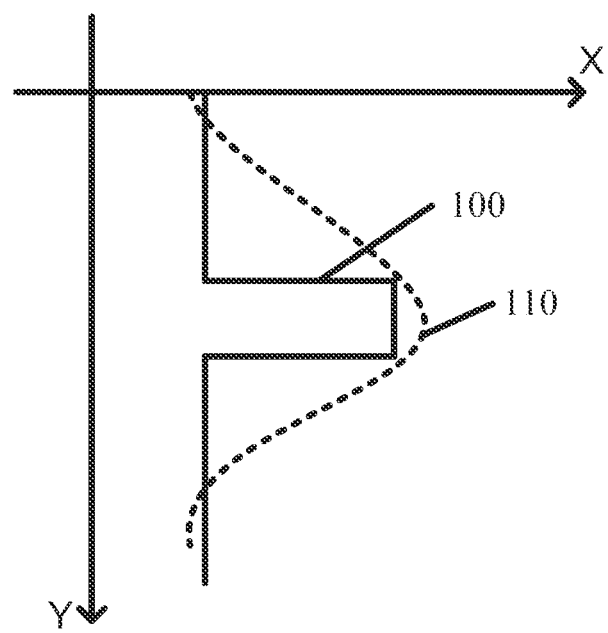
FIG. 2 illustrates a doped ion distribution diagram of a doped layer in a Fin FET structure.

In general, existing technologies may perform the doping process after the fin is formed. As shown in FIG. 1, after the fin 14 is formed, doping ions are doped into the internal region of fin 14 from the top of the fin 14. If the fin structure is represented in a coordinate plane, as shown in FIG. 2, the X-axis represents the doped ion concentration in the fin 14, and the Y-axis represents the distance from inside points of the fin 14 to the top of the fin 14. In an ideal doping scenario, the doped ion concentration in the fin 14 has a distribution curve as step curve 100. The doped ion concentration is high in the middle part of the fin 14, while the doped ion concentration at both ends of the fin 14 is low but is uniformly distributed, in a step manner.

However, in practice, the actual doped ion distribution in the fin 14 often is according to the smooth curve 110. The doped ion concentration is high in the middle part of the fin 14 and the doped ion concentration gradually decreases towards both ends of the fin 14 to form a doping tail. Thus, the top portion of the fin 14 may inevitably have ore doped ions than the ideal distribution, which may cause the later-formed fin FET have an increased gate leakage current and unstable performance.

One solution to improve the distribution curve is to etch the semiconductor substrate 300 to form a first sub-fin, and then a doping process is performed on top of the first sub-fin to dope the first sub-fin from top inwards. Afterwards, a second sub-fin is formed on the surface of the first sub-fin to form the entire fin structure. Such structure may suppress the gate leakage current.

Because the distribution of the doped ion concentration in the first sub-fin remains the same, i.e., the doped ion concentration in the middle part of the first sub-fin is high and gradually decreases towards the two ends of the first sub-fin, the stress in the channel region of the subsequently-formed semiconductor device is relative small. The smaller stress in the channel region may cause lower carrier mobility and, thus, a higher threshold voltage for the semiconductor device.

Another solution is to first perform a doping process on the semiconductor substrate 300 to form a doped layer. Further, the doped layer is etched to form the first sub-fin such that the surface of the first sub-fin has the highest doped-ion concentration. Afterwards, the second sub-fin, which is not doped, is formed on the surface of the first sub-fin. Such structure can increase the stress in the channel region of the subsequently-formed semiconductor device, increase the carrier mobility, and thus reduce the higher threshold voltage for the semiconductor device. At the same time, such structure can also reduce the gate leakage current.

For example, when the doped layer is used to form the first sub-fin with highest ion concentration on the surface of the first sub-fin, if the doped ion concentration in the doping layer is less than $5E18$ atoms/cm$^3$, the channel region of the semiconductor device may have a relative large stress; and if the doped ion concentration in the doping layer is also greater than $5E17$ atoms/cm$^3$, the channel region of the semiconductor device may have the largest stress. Thus, the doped ions in the doped layer can be used to subsequently increase the stress of the channel region, thus to increase the carrier mobility of the channel region, and to obtain a low threshold voltage of the semiconductor device.

When the semiconductor device is a p-channel Fin FET, the doped ions in the doped layer 303a and/or 303b may include germanium ions; when the semiconductor device is an n-channel Fin FET, the doped ions in the doped layer 303a and/or 303b may include carbon ions. Further, to avoid impact on the stress of the p-channel, the doped carbon ions in the doped layer corresponding to the p-channel Fin FET may be less than 1% of the total doped ions by volume, preferably less than 0.1%, so that the impact on the p-channel region of the Fin FET caused by the carbon ions can be kept to a minimum. Similarly, the doped germanium ions in the doped layer corresponding to the n-channel Fin FET may be less than 3% of the total doped ions by volume.

More particularly, returning to FIG. 5, the first region I may be used to form a p-channel Fin FET, and the second region II may be used to form an n-channel Fin FET. Thus, the first doped layer 303a on the first regional I may mainly include germanium ions, and the germanium ion concentration may be greater than $5E17$ atoms/cm$^3$ but less than $5E18$ atoms/cm$^3$, while the doped carbon ions in the first doped layer 303a on the first regional I may be less than 0.1% of the total doped ions by volume. Further, the second doped layer 303b in the second region II may mainly include carbon ions, and the carbon ion concentration may be greater than $5E17$ atoms/cm$^3$ but less than $5E18$ atoms/cm$^3$, while the doped germanium ions in the second doped layer 303b on the second region II may be less than 3% of the total doped ions by volume. Further, the first doped layer 303a and/or the second doped layer 303b may be doped with silicon with a pre-amorphous implantation (PAI).

Because the first doped layer 303a and the second doped layer 303b have different doped ion, masks may be formed on the surfaces of the first doped layer 303a and the second doped layer 303b separately to perform the doping processes. The distribution curve of the doped ion concentration of each of the first doped layer 303a and the second doped layer 303b may be approximate with the curve 110 in FIG. 2, i.e., the doped ion concentration is highest at the middle portion of each of the first doped layer 303a and the second doped layer 303b, and gradually decreases towards both ends of each of the first doped layer 303a and the second doped layer 303b. A doping peak depth may be measured from the top of the first doped layer 303a and the second doped layer 303b to the level having the peak or highest doped ion concentration.

Figure 6:
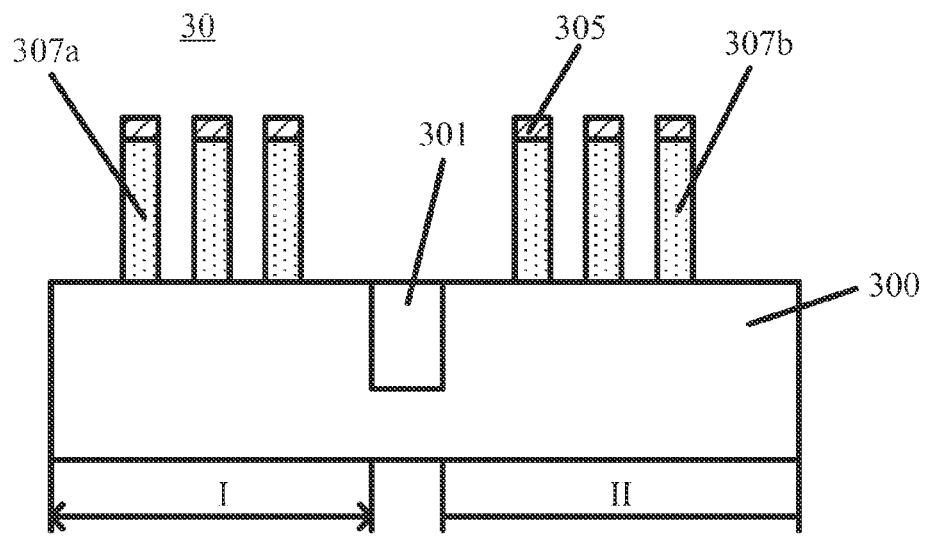

Returning to FIG. 3, after forming the first doped layer 303a and the second doped layer 303b (S203), a hard mask layer is formed on top of the doped layer 303a and 303b, and the doped layer 303a and 303b is etched using the hard mask as the mask to form the first sub-fin (S205). FIG. 6 shows a corresponding semiconductor device 30.

As shown in FIG. 6, a hard mask layer 305 is formed on top of the first doped layer 303a and the second doped layer 303b. Using the hard mask layer 305 as the mask, portions of the first doped layer 303a are etched to form the first sub-fin 307a in the first region I, and portions of the second doped layer 303b are etched to form the first sub-fin 307b in the second region II. The first sub-fin 307a and the first sub-fin 307b may each contain one or multiple fin structures.

The hard mask layer 305 may be made of materials different from the first doped layer 303a and the second doped layer 303b, such that the hard mask layer 305 can be removed conveniently. The etching process performed on the first doped layer 303a and the second doped layer 303b may include any appropriate etching process, such as a dry etching process or a wet etching process, etc.

Because the first sub-fin 307a in the first region 1 and the first sub-fin 307b in the second region II are etched from the first doped layer 303a and the second doped layer 303b, respectively, the doped ion concentration distribution of the first sub-fin 307a in the first region 1 is same as that of the first doped layer 303a; and the doped ion concentration distribution of the first sub-fin 307b in the second region II is same as that of the second doped layer 303b. That after the etching process using the hard mask layer 305 as the mask, the middle portions of the first sub-fin 307a in the first region 1 and the first sub-fin 307b in the second region II have the highest doped ion concentration, and the doped ion concentration gradually decreases towards the two ends of the first sub-fin 307a in the first region I and the first sub-fin 307b in the second region II.

In addition, an annealing process may be performed on the first doped layer 303a and the second doped layer 303b, such that the doped ions in the first doped layer 303a and the second doped layer 303b can be further diffused to form desired first sub-fin.

Figure 7:
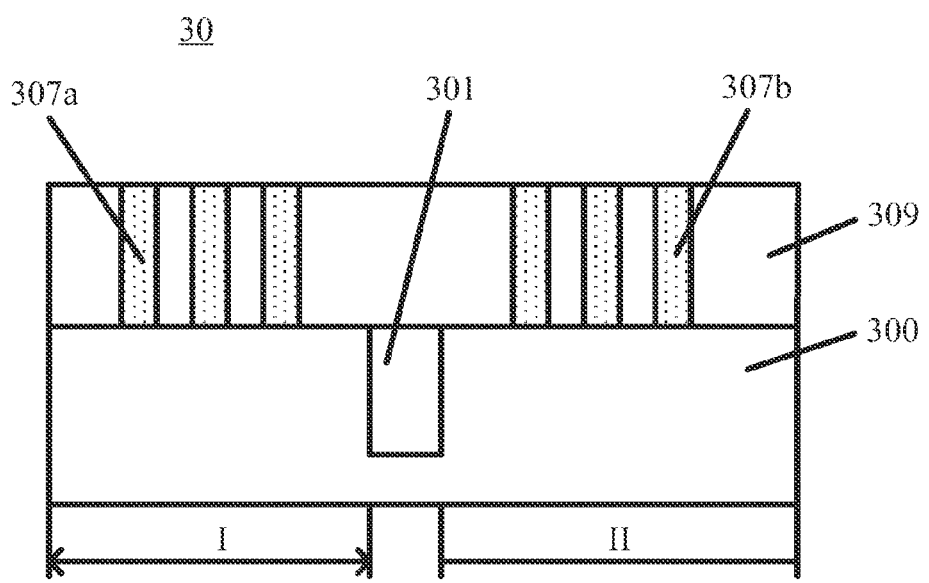

Returning to FIG. 3, after forming the first sub-fin (S205), an insulating layer is formed on top of the semiconductor substrate 300 and the top of the insulating layer levels with the top of the first sub-fin (S207). FIG. 7 shows a corresponding semiconductor device 30.

As shown in FIG. 7, an insulating layer 309 is formed on the surface of the semiconductor substrate 300. The top of the insulating layer 309 levels with the top of the first sub-fin 307a in the first region 1 and the top of the first sub-fin 307b in the second region II.

The insulating layer 309 is used to isolate various fin structures of the first sub-fin 307a and first sub-fin 307b and to subsequently form windows for the second sub-fin. The insulating layer 309 may be made of silicon oxide, silicon nitride, or silicon oxynitride, etc.

The insulating layer 309 may be formed by any appropriate process steps. For example, an insulating layer is first formed covering the semiconductor substrate 300, the first sub-fin 307a in the first region, and the first sub-fin 307b in the second region II. The insulating layer is then polished (e.g., using a chemical mechanical polishing process) or applied with a planarization process such that the top of the insulating layer is leveled with the top of the first sub-fin 307a in the first region I and the first sub-fin 307b in the second region II. In addition, the insulating layer 309 may also cover the hard mask layer 305, which may be removed by the polishing or planarization process. Further, the insulating layer 309 may be formed using any appropriate type of process, such as a chemical vapor deposition (CVD) process or a thermal oxidation process.

Figure 8:
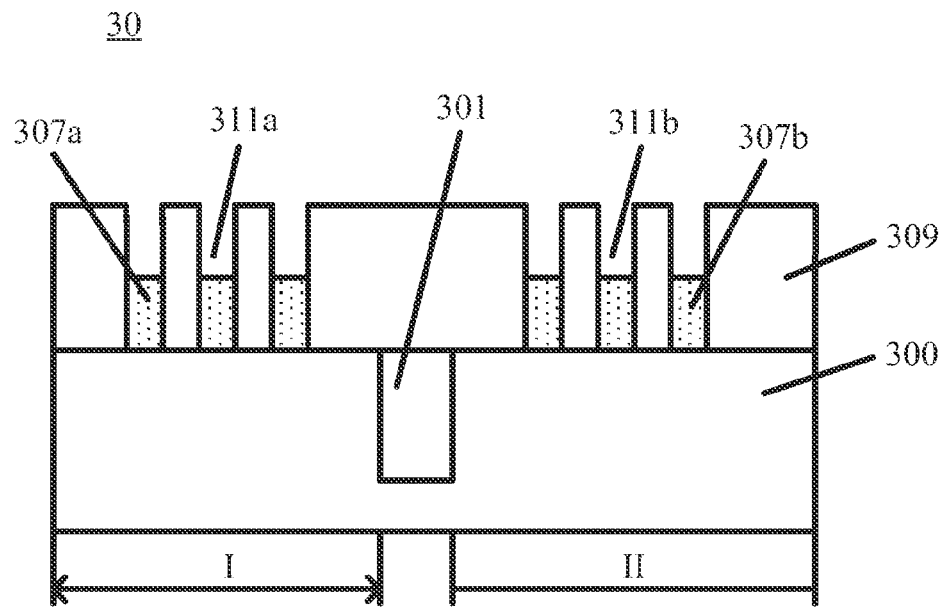

Returning to FIG. 3, after forming the insulating layer (S207), the top portion of the sub-fin is removed to form fin openings (S209). FIG. 8 shows a corresponding semiconductor device 30.

As shown in FIG. 8, certain upper portions of the first sub-fin 307a in the first region I and the first sub-fin 307b in the second region II are removed to for first openings 311a in the first region 1 and the second openings 311b in the second region II. The first openings 311a and the second openings 311b may be formed by an etching process, such as a dry etching process. Because the first sub-fin 307a and 307b may each includes one or multiple fin structures, the first openings 311a and the second openings 311b may also include corresponding one or multiple openings.

Because the final fin structures are formed by combining the first sub-fin and the second sub-fin formed on the top of the first sub-fin, the removed portion or the removal depth of the first sub-fin is controlled such that the final fin structures can have desired characteristics. For example, the stress of the channel region of the subsequently-formed semiconductor device may correspond to the doped ion concentration in the remaining first sub-fin 307a in the first region I and the remaining first sub-fin 307b in the second region II, after forming the first openings 311a and the second openings 311b.

When the doped ion concentration at the surface of the remaining first sub-fin 307a in the first region I and the remaining first sub-fin 307b in the second region II is the highest, the stress of the p-channel and/or the n-channel of the semiconductor device can be at maximum, and the carrier mobility of the p-channel and/or the n-channel of the semiconductor device can be at maximum. Thus, a significantly low threshold voltage of the semiconductor device can be achieved, and the performance of semiconductor device can be significantly improved.

More particularly, by controlling the etching process parameters, such as etching power and etching time, etc., the depth of the etched portions of the doped first sub-fin 307a in the first region I and the doped first sub-fin 307b in the second region II is set to a value such that the doped ion concentration at the surface of the remaining first sub-fin 307a in the first region 1 and the remaining first sub-fin 307b in the second region II is the highest. To ensure that the remaining first sub-fins 307a and 307b has the highest doped ion concentration at the top surface, the etch depth is set to reach the doping peak point of the doped layer 303a and 303b or over the doping peak point of the doped layer 303a and 303b. That is, the etch depth is set to equal to or greater than the doping peak depth. In certain embodiments, the depth of the etched portions the doped first sub-fin 307a in the first region I and the first sub-fin 307b in the second region II may be in a range of approximately 20-40 nm. That is, the depth of the first openings 311a and the second openings 311b may also be in a range of approximately 20-40 nm.

To control the etching process to achieve the etch depth, i.e., stopping at the doping peak depth, certain etching conditions may be monitored and used to control the etching depth. For example, the etching rate may be controlled to a substantially small value such that the etching depth can be controlled accurately. In one embodiment, the etching rate may be set at approximately 1 nm/minute. Further, the atomic signals of dopant are monitored. When the atomic signals of dopant stop increasing or start decreasing, it may be determined that the doping peak depth is reached or just passed. And the etching process is then stopped.

Figure 9:
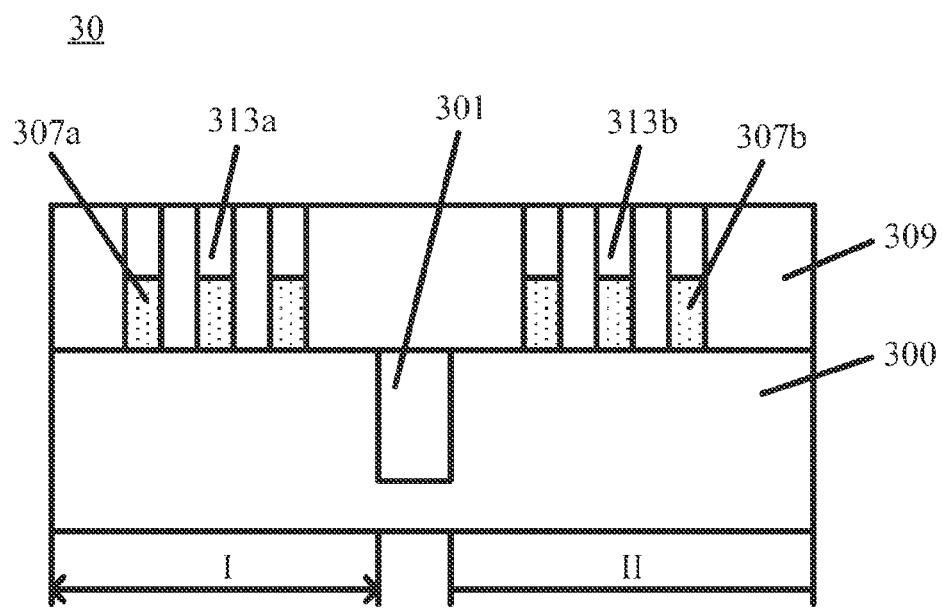

Returning to FIG. 3, after forming the fin openings, e.g., the first openings 311a and the second openings 311b (S209), a second sub-fin is formed in the fin openings and the top of the second sub-fin levels with the top of the insulating layer 309 (S211). FIG. 9 shows a corresponding semiconductor device 30.

As shown in FIG. 9, a second sub-fin 313a is formed in the first openings 311a in the first region I and a second sub-fin 313b is formed in the second openings 311b in the second region II. The top surface of the second sub-fin 313a and the second sub-fin 313b levels with the insulating layer 309. The second sub-fin 313a and the second sub-fin 313b may be formed separately or simultaneously. Because the first sub-fin 307a and 307b may each include one or multiple fin structures, the second sub-fin 313a and the second sub-fin 313b may also each include corresponding one or multiple fin structures.

The second sub-fin 313a and 313b and the first sub-fin 311a and 311b jointly form the fin structure(s) in the semiconductor device 30. Because the second sub-fins 313a and 313b are formed in the first openings 311a and the second openings 311b, and level with the surface of the insulating layer 309, the height of the second sub-fins 313a and 313b is same as the depth of the first openings 311a and the second openings 311b (e.g., approximately 20-40 nm).

Further, the second sub-fin 313a and 313b may be formed using selective epitaxial deposition process. The reaction gas used in the selective epitaxial deposition process may be $SH_2Cl_2$, HCl, and $H_2$; or may be $SiH_4$, HCl, and $H_2$. Other type of reaction gas may also be used. Certain process parameters for the selective epitaxial deposition process may be also configured, such as the deposition temperature being 650° C.-750° C. and the deposition chamber pressure being 0.3 Torr-1.0 Torr.

The second sub-fins 313a and 313b may be made of silicon, silicon germanium, germanium, silicon carbide, or other Group III-V compounds (e.g., gallium arsenide, indium phosphide, and gallium nitride, etc.). In certain embodiments, the second sub-fin 313a and 313b may be made of the same material, such as one of silicon, silicon germanium, germanium, silicon carbide, and any other Group III-V compound, and the second sub-fin 313a and 313b may be formed in a same deposition process. In addition, the second sub-fin 313a and 313b may be intrinsic, i.e., without doped ions, such that the gate leakage current of the semiconductor device 30 can be at minimum. Whether the second sub-fin 313a and 313b are un-doped or lightly doped, a significantly steep doping profile is maintained between the first sub-fins 307a and 307b such that the performance of the semiconductor device 30 can be improved.

Further, to make the sidewalls of the second sub-fin 313a and 313b smooth such that, when a gate structure is formed on the surfaces of the second sub-fin 313a and 313b, the gate dielectric layer in the gate structure can form a desired junction with the sidewalls of the second sub-fin 313a and 313b, an annealing process is performed on the sidewalls of the first openings 311a and the second openings 311b. More specifically, before forming the second sub-fin 313a and 313b, the annealing process is performing on the sidewalls of the first openings 311a and the second openings 311b using oxygen as the annealing gas and at an annealing temperature in a range of approximately 400° C.-700° C. preferably at approximately 600° C. Other types of gas may also be used.

In addition, to form desired junctions between the second sub-fin 313a and the first sub-fin 307a and between the second sub-fin 313b and the first sub-fin 307b, an annealing process is also performed on bottoms of the first openings 311a and the second opening 311b (i.e., the doped semiconductor substrate or the top of the first sub-fin 307a and 307b). The gas used in the annealing process may include hydrogen and argon and helium, or hydrogen and neon, i.e., hydrogen and one or more of argon, helium, and neon. Other type of gas may also be used.

Figure 10:
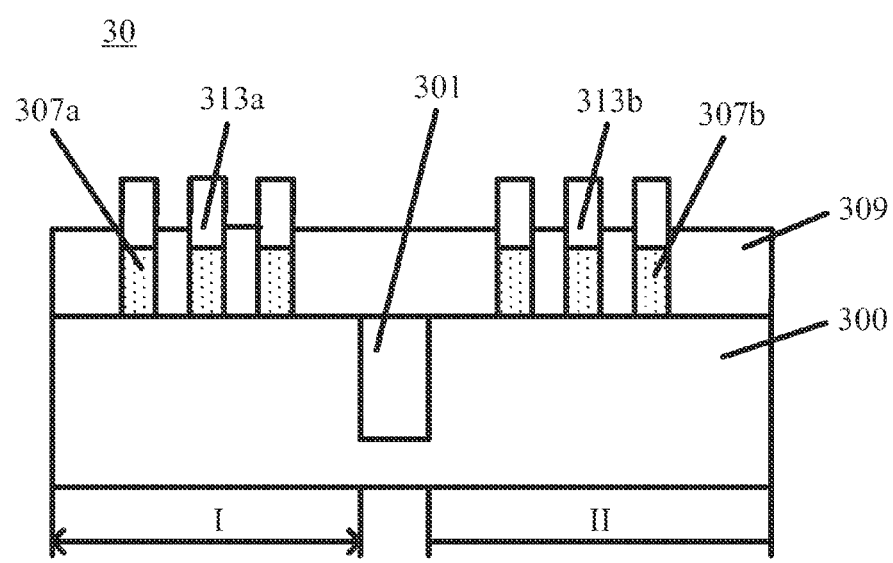

Further, as shown in FIG. 10, additional process steps may be performed to facilitate forming a gate structure covering the top and sidewalls of the second sub-fin 313a and 313b in the semiconductor device 30. For example, portions of the insulating layer 309 may be removed such that the surface level of the remaining insulating layer 309 is higher than that of the remaining first sub-fin 307a in the first region 1 and the remaining first sub-fin 307b in the second region II, or is the same as that of the remaining the first sub-fin 307a in the first region 1 and the remaining first sub-fin 307b in the second region II.

In certain embodiments, the depth of the removed portion of the insulating layer 309 may be in a range of approximately 25-35 nm and, after the removal of the portion of the insulating layer 309, the surface level of the remaining insulation layer 309 is higher than that of the remaining first sub-fin 307a in the first region I and the remaining first sub-fin 307b in the second region II. The portion of the insulating layer 309 may be removed by an STI etching process.

Thus, the fin structure(s) of the semiconductor device 30 is completed. Because the semiconductor substrate is doped to form a doped layer before forming the first sub-fin structures, the doped ion concentration at the surface of the first sub-fin structures is the highest. The stress of the channel region of the subsequently-formed semiconductor device is significantly large, and the carrier mobility of the channel region is increased. Thus, the semiconductor device has a low threshold voltage and desired performance. Further, because the second sub-fin is intrinsic, the semiconductor device has a small gate leakage current and the performance of semiconductor device is stable.

Optionally or additionally, other fabrication processes can be performed to form a Fin FET as the semiconductor device 30. For example, a gate structure (not shown) may be formed across the top and sidewalls of the second sub-fin 313a and the second sub-fin 313b; and source/drain regions (not shown) are formed at two sides of the gate structure and inside the first sub-fins 307a and 307b. The gate structure includes a gate dielectric layer across the top and sidewalls of the second sub-fin 313a and 313b, and a gate electrode layer covering the gate dielectric layer. The gate dielectric layer may be made of silicon oxide or a high-K dielectric material, and the gate electrode layer may be made of polysilicon or metal.

Accordingly, an enhanced Fin FET can be manufactured according to the disclosed structures and methods. The Fin FET can have large stress in all channel regions, a high carrier mobility, a low threshold voltage, and a good device performance. Further, such Fin FET may have a small gate leakage current and a good stability.

Other applications, advantages, alternations, modifications, or equivalents to the disclosed embodiments are obvious to those skilled in the art.

What is claimed is:

1. A method for fabricating a semiconductor structure, comprising:
   providing a semiconductor substrate having a first region and a second region;

doping top of the semiconductor substrate to form a doped layer at top surface of the semiconductor substrate over the first region and the second region;

etching the doped layer to form a first sub-fin in the first region and a first sub-fin in the second region;

forming an insulating layer over the semiconductor substrate including the first sub-fin in the first region and the first sub-fin in the second region;

removing top portions of the first sub-fin in the first region and the first sub-fin in the second region to form a corresponding first opening and second opening, respectively; and forming a second sub-fin in the first opening and a second sub-fin in the second opening such that the first sub-fin in the first region and the second sub-fin in the first opening jointly form a complete fin in the first region, and the first sub-fin in the second region and the second sub-fin in the second opening jointly form a complete fin in the second region.

2. The method according to claim 1, wherein:
a depth of the removed top portions of the first sub-fin in the first region and the first sub-fin in the second region is controlled such that a doped ion concentration is the highest at a top surface of remaining first sub-fin in the first region and first sub-fin in the second region.

3. The method according to claim 1, wherein:
a depth of the removed top portions of the first sub-fin in the first region and the first sub-fin in the second region is equal to or greater than a doping peak depth of the doped layer.

4. The method according to claim 1, wherein etching the doped layer further includes:
forming a hard mask layer over the doped layer; and
etching the doped layer using the hard mask layer as a mask to form the first sub-fin in the first region and the first sub-fin in the second region.

5. The method according to claim 1, wherein forming the insulating layer further includes:
performing a planarization process on the insulating layer such that a top surface of the insulating layer levels with a top surface of the first sub-fin in the first region and the first sub-fin in the second region.

6. The method according to claim 1, wherein:
a top surface of the second sub-fin in the first opening and the second sub-fin in the second opening levels with a top surface of the insulating layer.

7. The method according to claim 1, wherein:
the doped layer has a doped on concentration greater than 5E17 atoms/cm$^3$ and less than 5E18 atoms/cm$^3$.

8. The method according to claim 1, wherein:
the doped ions in the doped layer include germanium ions, and carbon ions in the doped layer is less than 1% of total doped ions by volume.

9. The method according to claim 1, wherein:
the doped ions in the doped layer include carbon ions, and germanium ions in the doped layer is less than 3% of total doped ions by volume.

10. The method according to claim 1, wherein:
the insulating layer is made of one of silicon oxide, silicon nitride, and silicon oxynitride.

11. The method according to claim 1, before forming the second sub-fin in the first opening and the second sub-fin in the second opening, further including:

performing an annealing process on sidewalls of the first opening and the second opening using oxygen as an annealing gas and at a temperature in a range of approximately 400° C.-700° C.

12. The method according to claim 1, before forming the second sub-fin in the first opening and the second sub-fin in the second opening, further including:
performing an annealing process on bottoms of the first opening and the second opening using an annealing gas including hydrogen and one or more of argon, helium, and neon.

13. The method according to claim 1, further including:
removing portions of the insulating layer such that a surface level of remaining insulating layer is higher than that of the remaining first sub-fin in the first region and the remaining first sub-fin in the second region;
forming a gate structure across top and sidewalls of the second sub-fin in the first opening and the second sub-fin in the second opening; and
forming source and drain regions at two sides of the gate structure and inside the first sub-fin in the first region and the first sub-fin in the second region.

14. A semiconductor structure, comprising:
a semiconductor substrate having a first region and a second region;
a doped layer formed at top surface of the semiconductor substrate over the first region and the second region by doping the semiconductor substrate;
a first sub-fin in the first region and a first sub-fin in the second region formed by etching the doped layer;
an insulating layer formed over the semiconductor substrate including the first sub-fin in the first region and the first sub-fin in the second region; and
a second sub-fin in the first region and a second sub-fin in the second region formed over the first sub-fin in the first region and the first sub-fin in the second region, respectively, by:
removing top portions of the first sub-fin in the first region and the first sub-fin in the second region to form a corresponding first opening and second opening, respectively; and
forming the second sub-fin in the first region in the first opening and the second sub-fin in the second region in the second opening such that the first sub-fin in the first region and the second sub-fin in the first opening jointly form a complete fin in the first region, and the first sub-fin in the second region and the second sub-fin in the second opening jointly form a complete fin in the second region.

15. The semiconductor structure according to claim 14, wherein:
a depth of the removed top portions of the first sub-fin in the first region and the first sub-fin in the second region is equal to or greater than a doping peak depth of the doped layer such that a doped ion concentration is the highest at a top surface of remaining first sub-fin in the first region and first sub-fin in the second region.

16. The semiconductor structure according to claim 14, wherein:
a planarization process is performed on the insulating layer such that a top surface of the insulating layer levels with a top surface of the first sub-fin in the first region and the first sub-fin in the second region.

17. The semiconductor structure according to claim 14, wherein:
the doped layer has a doped ion concentration greater than 5E17 atoms/cm$^3$ and less than 5E18 atoms/cm$^3$.

18. The semiconductor structure according to claim 14, wherein:
    the doped ions in the doped layer include germanium ions, and carbon ions in the doped layer is less than 1% of total doped ions by volume.

19. The semiconductor structure according to claim 14, wherein:
    the doped ions in the doped layer include carbon ions, and germanium ions in the doped layer is less than 3% of total doped ions by volume.

20. The semiconductor structure according to claim 14, wherein portions of the insulating layer is removing such that a surface level of remaining insulating layer is higher than that of the remaining first sub-fin in the first region and the remaining first sub-fin in the second region, the semiconductor device further includes:
    a gate structure formed across top and sidewalls of the second sub-fin in the first opening and the second sub-fin in the second opening; and
    source and drain regions formed at two sides of the gate structure and inside the first sub-fin in the first region and the first sub-fin in the second region.

\* \* \* \* \*